(12) United States Patent
Wang

(10) Patent No.: US 8,716,803 B2
(45) Date of Patent: May 6, 2014

(54) 3-D SINGLE FLOATING GATE NON-VOLATILE MEMORY DEVICE

(71) Applicant: FlashSilicon Incorporation, Diamond Bar, CA (US)

(72) Inventor: Lee Wang, Diamond Bar, CA (US)

(73) Assignee: FlashSilicon Incorporation, Diamond Bar, CA (US)

( * ) Notice: Subject to any disclaimer, the term of this patent is extended or adjusted under 35 U.S.C. 154(b) by 0 days.

(21) Appl. No.: 13/644,880

(22) Filed: Oct. 4, 2012

(65) Prior Publication Data

US 2014/0097483 A1    Apr. 10, 2014

(51) Int. Cl.
*H01L 29/76* (2006.01)
(52) U.S. Cl.
USPC ........... 257/365; 257/192; 257/202; 257/369; 257/506
(58) Field of Classification Search
USPC .............. 257/65–67, 77, 192, 202, 250, 365, 257/369, 506, E29.242; 438/585–588
See application file for complete search history.

(56) References Cited

U.S. PATENT DOCUMENTS

| | | | |
|---|---|---|---|
| 7,154,118 B2* | 12/2006 | Lindert et al. | 257/66 |
| 7,560,756 B2* | 7/2009 | Chau et al. | 257/287 |
| 7,902,014 B2* | 3/2011 | Doyle et al. | 438/197 |
| 2004/0108523 A1* | 6/2004 | Chen et al. | 257/202 |
| 2010/0276761 A1* | 11/2010 | Tung et al. | 257/384 |
| 2011/0068405 A1* | 3/2011 | Yuan et al. | 257/365 |

* cited by examiner

*Primary Examiner* — Dung A. Le
(74) *Attorney, Agent, or Firm* — Muncy, Geissler, Olds & Lowe, P.C.

(57) ABSTRACT

A 3-D Single Floating Gate Non-Volatile Memory (SF-GNVM) device based on the 3-D fin Metal-Oxide-Semiconductor Field Effect Transistor (MOSFET) is disclosed. The disclosed Non-Volatile Memory (NVM) device consists of a pair of semiconductor fins and one floating metal gate. The floating metal gate for storing electrical charges to alter the threshold voltage of the fin MOSFET crosses over the pair of semiconductor fins on top of coupling and tunneling dielectrics above the surfaces of the two semiconductor fins. One semiconductor fin with the same type impurity forms the control gate of the non-volatile memory device. The other semiconductor fin is doped with opposite type of impurity in the channel regions under the metal floating gate and with the same type of impurity in the source and drain regions on the sides of the crossed metal floating gate.

10 Claims, 6 Drawing Sheets

(a) Capacitance-coupling configuration (b) Direct-coupling configuration

Fig. 4a Logarithmic scale

Fig. 4b Linear scale

US 8,716,803 B2

3-D SINGLE FLOATING GATE NON-VOLATILE MEMORY DEVICE

BACKGROUND OF THE INVENTION

1. Field of the Invention

This invention relates to a 3-D semiconductor Non-Volatile Memory (NVM) cell devices. The semiconductor NVM cell device of the invention can be processed with the advanced finFET (fin-shape Field Effect Transistor) process technology applied for manufacturing standard Complementary Metal Oxide Semiconductor Field Effect Transistors (CMOSFET) below 20 nm process technology nodes. In particular, the 3-D Single Floating Gate Non-Volatile Memory (SFGNVM) device of the invention consists of one floating metal gate for storing charges and two semiconductor fins for the body of Metal-Oxide-Semiconductor Field Effect Transistor (MOSFET) and control gate, respectively.

2. Description of the Related Art

CMOS process becomes the most popular fabrication process for Application Specific Integrated Circuit (ASIC). An ASIC contains the specific functionality of a device or a system on a single Integrated Circuit (IC) or a chip. In digital age the entire electronic devices or equipments are controlled and operated by IC chips. For various applications the capability of implementing multiple functions on the same circuit hardware becomes economically desirable. Thus, the flexibility to change for the specific functionality or configuration operating on IC chips is required for many various applications. For instance, the initial programming and configuring a microprocessor require a programmable non-volatile memory to store the programmed instructions. The non-volatile memory retains its stored digital information, even when the powers for the electronic systems are "off". The stored digital information or instructions can be recalled, when the electronic system are turned on. Furthermore, the programmable instructions shall be allowed to change any time without changing the hardware during developments. The non-volatile memory of storing programmed codes and data for electronic systems are done by Electrically Erasable Programmable Read-Only Memory (EEPROM) devices. EEPROM is a semiconductor NVM capable of being erased and programmed by applying electrical voltage biases to the electrodes of memory devices.

In the conventional EEPROM fabrication process, the control gates of EEPROM memory cells are fabricated above an isolated conductive layer as the floating gate or a stack of dielectric layers like Oxide-Nitride-Oxide (ONO) for storing electrical charges on top of silicon channel surfaces. However, in the conventional CMOS process broadly applied to most ASIC fabrications, only one single conducting gate layer is fabricated for the switching gates of MOSFET devices. The EEPROM fabrication process for the extra charge storing layers requires several process steps such as film deposition, etching, and photolithography for patterning. These additional process steps in comparison with the conventional CMOS process result in fabrication cost increases, process complexity, circuit yield impact, and longer process time. Thus, EEPROM processed with no extra storage layer and compatible with CMOS baseline process are very desirable for embedded EEPROM ASICs.

Meanwhile, on the road of scaling down MOSFET devices to gain the higher device density and higher performance in IC, the conventional planar structures of MOSFET devices illustrated in FIG. 1a have reached a limit below 20 nm process technology node. The deteriorated short channel margin for planar MOSFET becomes the major hurdle for scaling down the MOSFET devices. To overcome such hurdle, 3-D finFET devices illustrated in FIG. 1b have been becoming the main stream MOSFET devices below 20 nm process technology nodes. To meet the need for embedded non-volatile memory storage below 20 nm process technology nodes in CMOS, we have proposed a new semiconductor non-volatile memory device based on the 3-D finFET process technology. The Single Floating Gate Non-Volatile Memory (SFGNVM) devices of the invention are single gate devices and fully compatible with the 3-D finFET process without involving any new process or any unconventional material in the process technology.

In another aspect of scaling down semiconductor non-volatile device beyond 20 nm process technology node, the conventional semiconductor non-volatile memory devices are also hitting a hurdle for floating gate non-volatile memory devices due to the limitation of lithographic and etch processes such as double-gate alignment and ultra-high an-isotropic etch aspect ratio in the stacked double-gate process. Since the SFGNVM devices of the invention are single-gate devices the limitation of process capability for the stacked double-gate in 20 nm and beyond is automatically lifted off.

SUMMARY OF THE INVENTION

A 3-D Single Floating Gate Non-Volatile Memory (SFGNVM) device 200 of the invention based on the 3-D fin Metal-Oxide-Semiconductor Field Effect Transistor (MOSFET) is shown in FIG. 2. The 3-D SFGNVM device 200 is built on an isolation surface 202 on top of a silicon substrate 201. The SFGNVM device 200 consists of a metal floating gate 260 and two semiconductor fins 230A and 230B. One semiconductor fin 230A with the same type of impurity surrounded by the metal floating gate 260 above the coupling dielectric 251 on the surfaces of semiconductor fin 230A forms the control gate of the SFGNVM device 200. The other semiconductor fin 230B with same impurity forms the source electrode 210 and drain electrode 220 on the sides of metal floating gate 260. The channel region 240 with the opposite type of impurity of source 210, drain 220, and control gate 230A is surrounded by the metal floating gate 260 above the tunneling dielectric 250 on the surfaces of fin channel region 240. The metal floating gate 260, channel 240, source 210, and drain 220 forms the body of fin MOSFET.

FIG. 3a shows the equivalent circuit schematic for SFGNVM device with the control gate 230A and the floating gate 260 isolated from each other (hereinafter called capacitance-coupling configuration). The capacitance between the floating gate 260 and the control gate 230A and the capacitance between the floating gate 260 and the channel 240 of the MOSFET are denoted by $C_{CG}$ and $C_{MOS}$, respectively. By applying a control gate voltage $V_{CG}$, the function of field effect transistor in the channel regions 240 for the SFGNVM device 200 is generated from the floating gate 260 through the capacitance coupling of the control gate semiconductor fin 230A. According to the schematic of capacitance-coupling configuration of the SFGNVM device (series capacitors of control gate-floating gate-channel) in FIG. 3a, the voltage potential $V_f$ at the floating gate 260 is given by: $V_f=(V_{CG} \times C_R)$, where $V_{CG}$ is the applied control gate voltage and $C_R$ is a coupling ratio expressed as $C_R=C_{CG}/(C_{CG}+C_{MOS})$. FIG. 3b shows the schematic of SFGNVM device with the control gate 230A and the floating gate 260 connected together (hereinafter called direct-coupling configuration). When a gate voltage is directly applied to the control gate 230A and floating gate 260 as shown in FIG. 3b, it is equivalent to applying a gate voltage directly to the gate of the MOSFET device without capacitance coupling from the control gate 230A to the floating gate 260, i.e., no voltage difference between control gate 230A and floating gate 260.

FIGS. 4a and 4b show the control gate voltage versus drain current characteristic curves for MOSFET device with direct-coupling configuration and capacitance-coupling configuration, respectively. SFGNVM devices 200 have no stored electrical charges on their floating gate after UV (Ultra-Violet) light exposure. The coupling ratio $C_R$ for the SFGNVM device 200 is measured to be 0.5. The relation between the threshold voltage $V_{thD}$ for direct-coupling configuration and the threshold voltage $V_{thC}$ for capacitance-coupling configuration are approximately given by $V_{thD} \sim (C_R \times V_{thC})$. The ratio (s2/s1) of the two slopes of the drain "on" current versus control gate voltage curves in linear scale of FIG. 4b for direct-coupling configuration and capacitance-coupling configuration is approximately expressed as: $s2/s1 = C_R = 0.5$. It is noted that the above value of the coupling ratio is provided by way of example and not limitation of the invention.

The semiconductor non-volatile memory device storing charges on a layer of charge storage material such as a metal floating gate above the channel surface of a MOSFET. The amounts of charges in the storing layer can affect the threshold voltage applied to the control gate to turn on the channel of the MOSFET device. For instance, the threshold voltage of semiconductor non-volatile memory device shifts to a higher threshold voltage from storing electrons (negative charge) on the floating gate, and shifts to a lower threshold voltage from storing holes (positive charge) on the floating gate. The threshold voltage shift is given by $\Delta V_{thC} = -Q/Cco$, where Q is the amount of charges on the floating gate 260 and $C_{CG}$ is the coupling capacitance between control gate 230A and floating gate 260. As the measured curves for drain current versus control gate voltage of SFGNVM device in FIG. 5, the curve for the programmed device with electrons on the floating gate is parallel shifted to the higher threshold voltage $V_{thp}$ (to the right), while the curve for the erased device is parallel shifted to the lower threshold voltage $V_{the}$ (to the left), where $V_{thp}$ and $V_{the}$ respectively denote the threshold voltages for a programmed SFGNVM device and an erased SFGNVM device. The curve in the middle is for the SFGNVM device with intrinsic threshold voltage $V_{thC}$, where no electrical charges are stored on the floating gate 260 after UV light exposure.

When a control gate voltage $V_{CG}$, $V_{the} < V_{CG} < V_{thp}$, is applied to the control gate 230A of SFGNVM device 200, the erased devices with low threshold voltage are then turned on and the programmed devices with high threshold voltage remain "off. For storing digital data "0" and "1", one may define the programmed state with high threshold voltage to be "0" and the erased state with low threshold voltage to be "1", respectively, and vise versa. Since the charges stored on the floating gate 260 can be retained for a period of long time at least 10 years the stored data represented by the programmed state or erased state are non-volatile. By changing the threshold voltages (programmed and erased), the non-volatile data of "0" or "1" is stored in the SFGNVM device 200.

BRIEF DESCRIPTION OF THE DRAWINGS

For a better understanding of the present invention and to show how it may be carried into effect, reference will now be made to the following drawings, which show the preferred embodiments of the present invention, in which.

DETAILED DESCRIPTION OF THE INVENTION

Figures 1A, 1B:
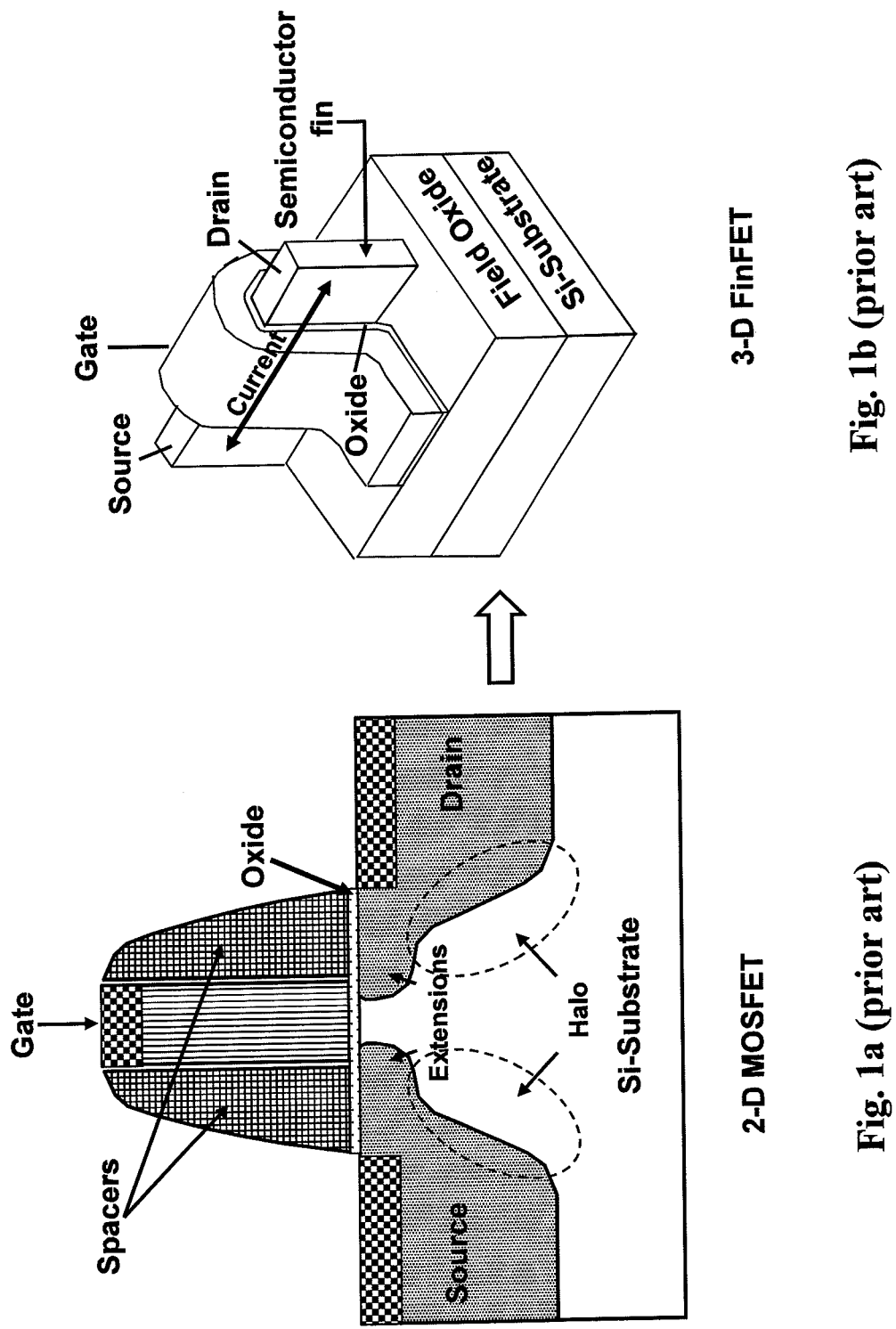
FIGS. 1a and 1b respectively show (a) a cross section of 2-D MOSFET (b) a 3D view of the 3-D fin MOSFET according to prior arts.
Figure 2:
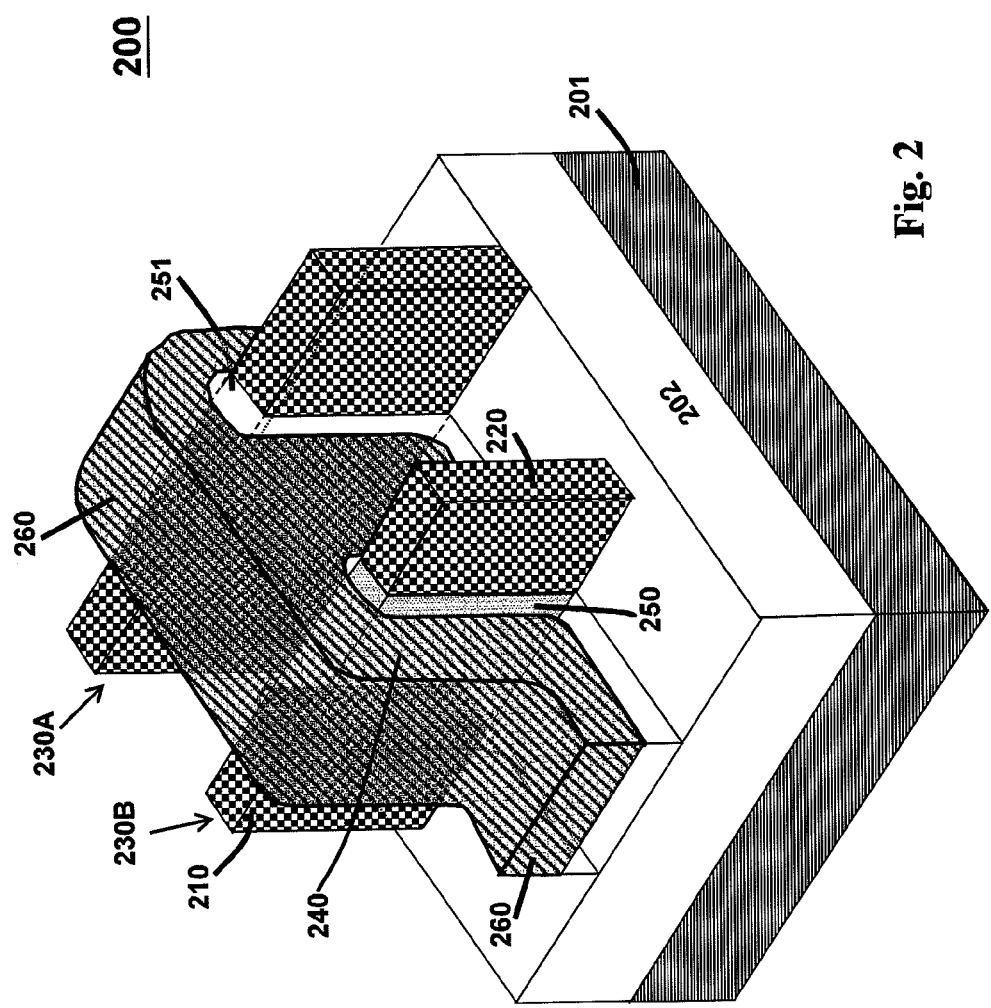
FIG. 2 shows the 3-D view of Single Floating Gate Non-Volatile Memory (SFGNVM) device according to an embodiment of the invention.
Figure 3:
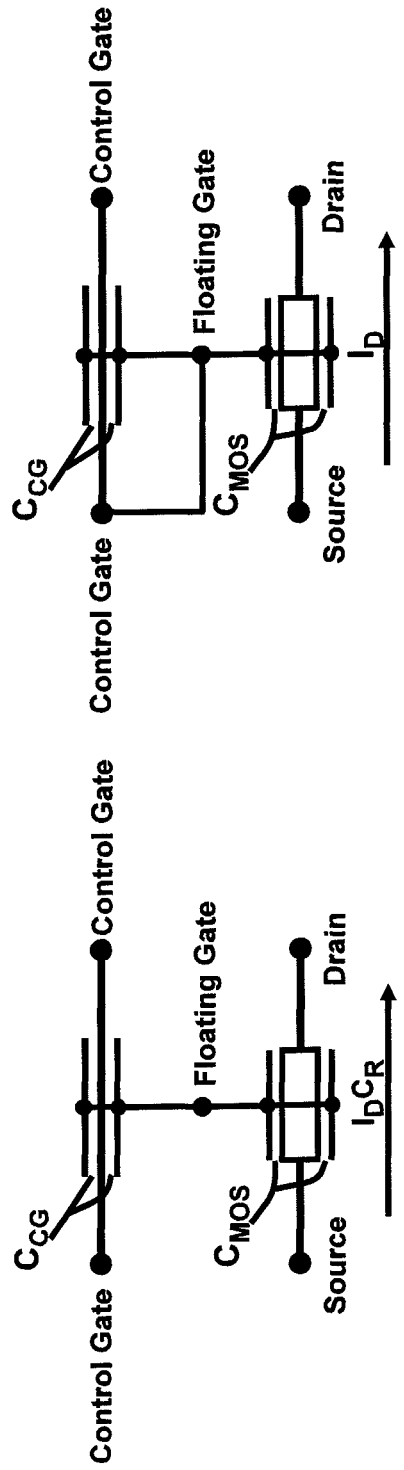
FIG. 3 shows the schematics of the 3-D fin SFGNVM device (a) with isolated control gate and floating gate (b) with control gate and floating gate connected together.
Figure 4:
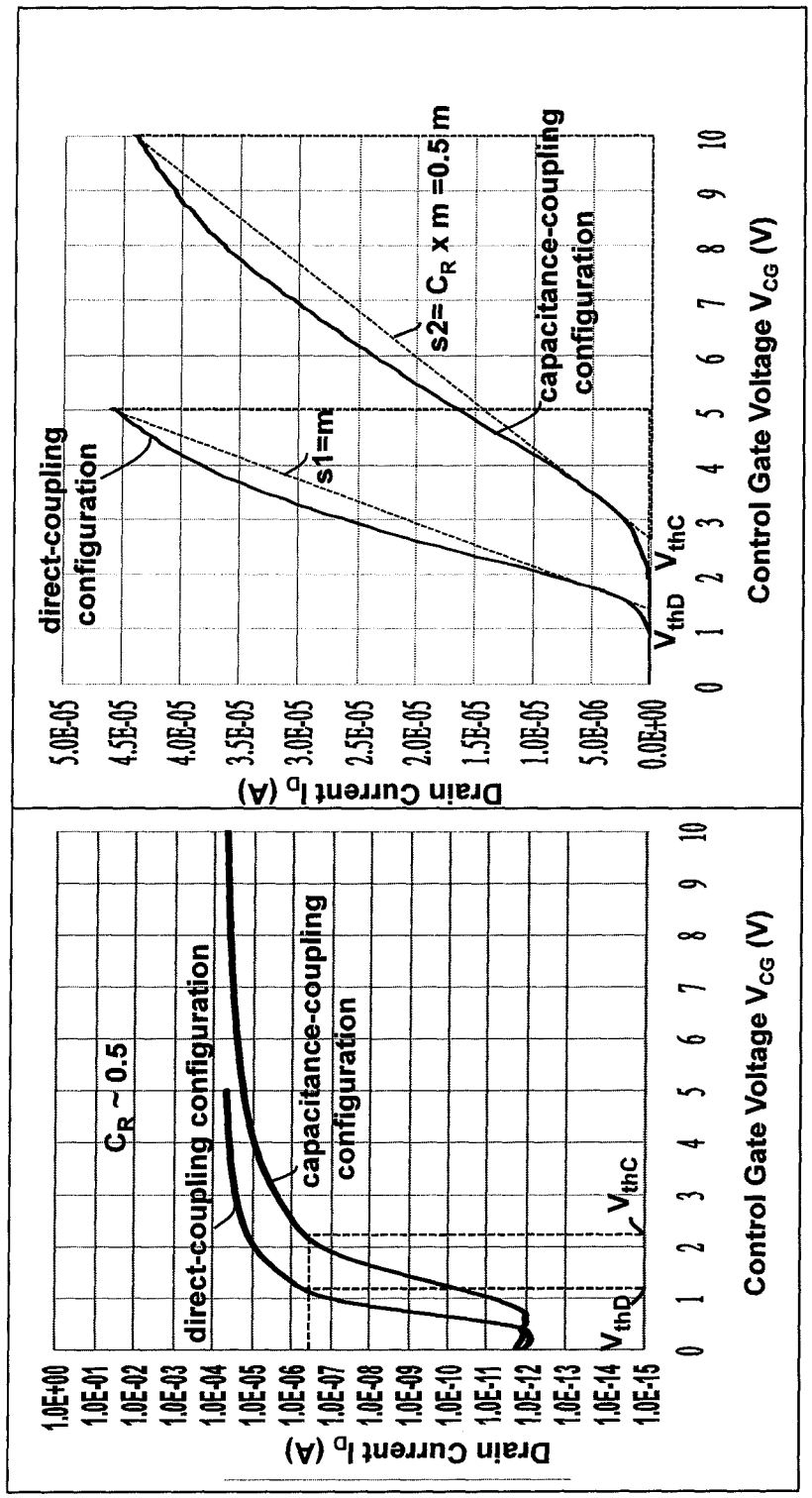
FIGS. 4a and 4b respectively show drain current versus control gate voltage curves for a SFGNVM device after UV light exposure on a logarithmic scale (left) and on a linear scale (right). The curves sweep for the direct-coupling configuration and the capacitance-coupling configuration
Figure 5:
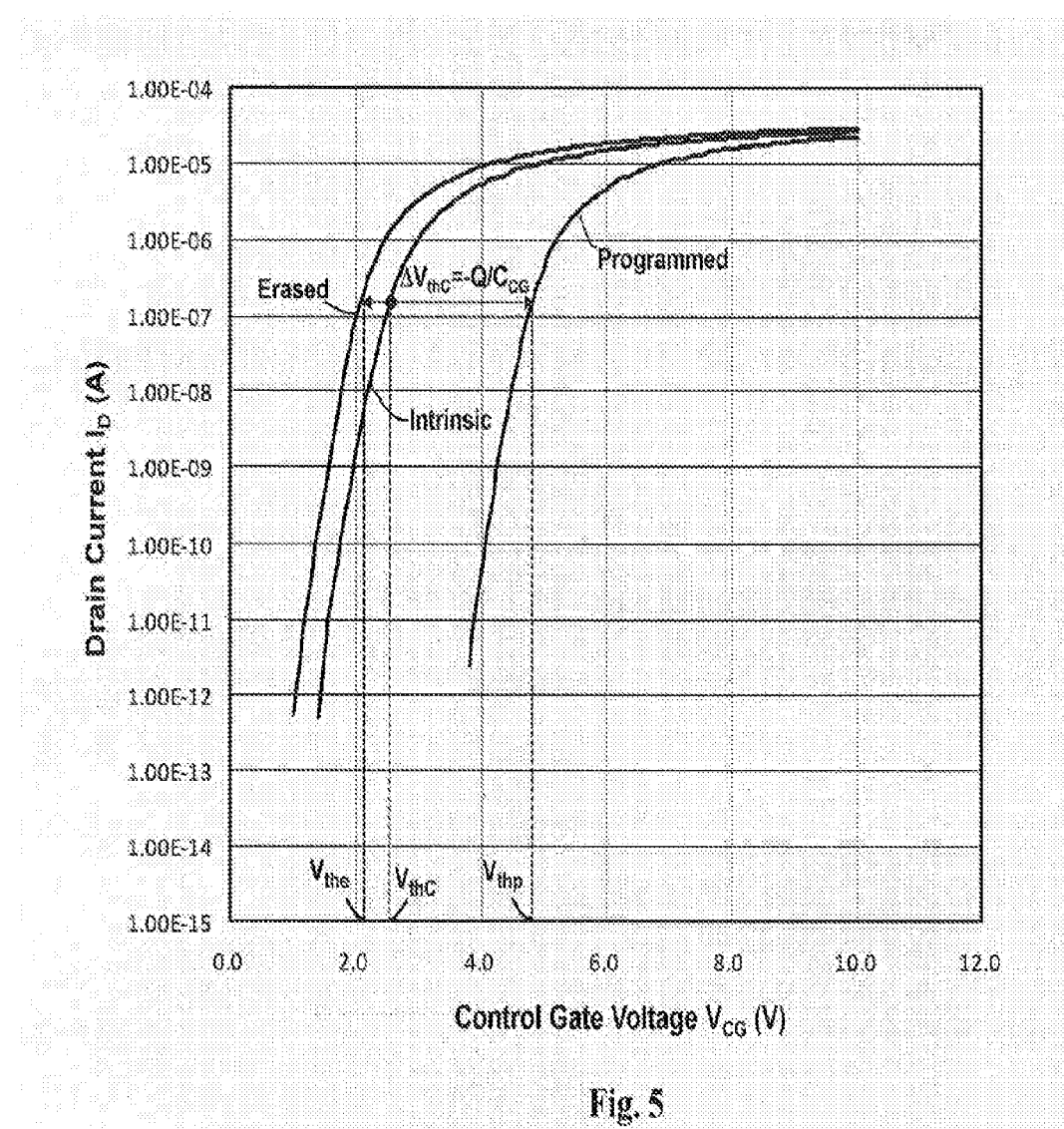
FIG. 5 shows the measured drain current versus control gate voltage curves for erased, intrinsic, and programmed states of a SFGNVM device.

The following detailed description is meant to be illustrative only and not limiting. It is to be understood that other embodiment may be utilized and structural changes may be made without departing from the scope of the present invention. Also, it is to be understood that the phraseology and terminology used herein are for the purpose of description and should not be regarded as limiting. Those of ordinary skill in the art will immediately realize that the embodiments of the present invention described herein in the context of methods and schematics are illustrative only and are not intended to be in any way limiting. Other embodiments of the present invention will readily suggest themselves to such skilled persons having the benefits of this disclosure.

In one embodiment of forming the semiconductor fins 230A and 230B for control gate and the body of MOSFET, a Silicon-On-Insulator (SOI) wafer is patterned and etched to form a plurality of silicon fins on the oxide insulator 202 and silicon substrate 201. The semiconductor fins 230A for the control gates are selectively doped with high concentration of one impurity. The semiconductor fins 230B for the MOSFET body are selectively doped with low concentration of the opposite impurity to form the channel region 240 of the MOSFET. A thin oxides (10A~20A) are grown on the surface of all semiconductor fins 230A and 230B using rapid thermal process. Thick oxides (60A~70A) are deposited to the semiconductor fins 230B for the body of MOSFET to form tunneling oxides 250. Meanwhile, couple dielectrics, the same tunneling oxides or a stack of high-k dielectric film, are deposited to the surfaces of semiconductor fins 230A for the control gate to form the coupling dielectric 251. A metal film is then deposited, patterned, and etched to from the metal floating gate 260. An in-situ doped epitaxial film with the same impurity is grown to form the source electrode 210, drain electrode 220, and control gate electrode 230A of the SFGNVM device 200. The SFGNVM devices 200 are formed after completing the above process. Noting that the above described process steps for forming SFGNVM device 200 are the standard process steps and can be incorporated in making the fin MOSFET for CMOS.

Figure 6:
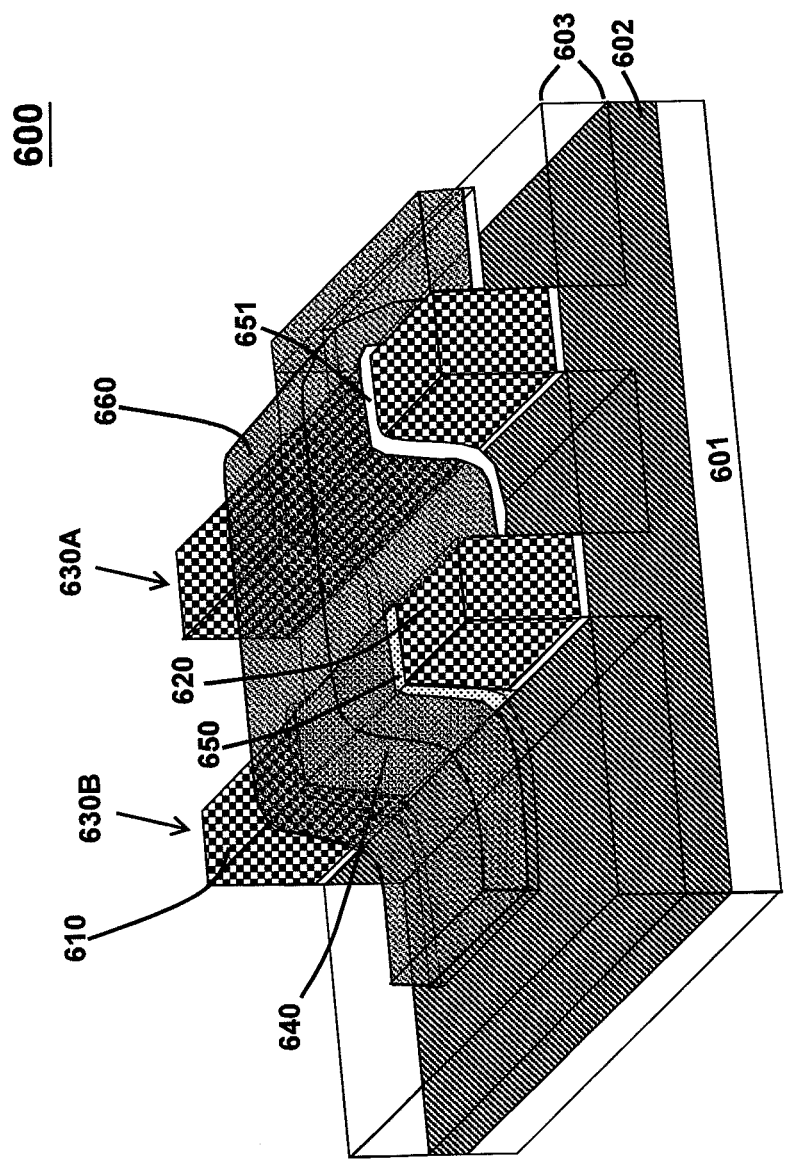
FIG. 6 shows the 3-D view of a SFGNVM device fabricated on bulk semiconductor according to another embodiment of the invention.

In another embodiment of forming the semiconductor fins 630A and 630B for the control gate and the body of MOSFET, a bulk epitaxial wafer with a buried layer of high concentration impurity semiconductor 602 on silicon substrate 601 is patterned and etched to plurality of semiconductor fins as shown in FIG. 6. The semiconductor fins 630A and 630B are half filled with trench oxide 603. The semiconductor fins 630A for the control gate are selectively doped with high concentration of one impurity. The semiconductor fins 630B for the MOSFET body are selectively doped with low concentration of the opposite impurity used to form the channel region 640 of the MOSFET. A thin oxides (10A~20A) are grown on the surface of all semiconductor fins 630A and 630B using rapid thermal process. Thick oxides (60A~70A) are deposited to the semiconductor fins 630B for the body of MOSFET to form tunneling oxides 650. Meanwhile, couple dielectrics, the same tunneling oxides or a stack of high-k dielectric film, are deposited to the surfaces of semiconductor fins 630A for the control gate to form the coupling dielectric 651. A metal film is then deposited, patterned, and etched to from the metal floating gate 660. An in-situ doped epitaxial film with the same impurity is grown to form the source electrode 610, drain electrode 620, and control gate electrode 630A of the SFGNVM device 600. The SFGNVM devices 600 are formed after completing the above process. Noting that the above described process steps for forming SFGNVM device 600 are the standard process steps and can be incorporated for manufacturing the fin MOSFET for CMOS.

The aforementioned description of the preferred embodiments of the invention has been presented for purposes of illustration and description. It is not intended to be exhaustive or to limit the invention to the precise form or to exemplary embodiments disclosed. Accordingly, the description should be regarded as illustrative rather than restrictive. Obviously, many modifications and variations of geometrical shapes including lengths and widths, gate material or tunneling dielectrics will be apparent to practitioners skilled in this art. The embodiments are chosen and described in order to best explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like is not necessary limited the claim scope to a specific embodiment, and the reference to particularly preferred exemplary embodiments of the invention does not imply a limitation on the invention, and no such limitation is to be inferred. The invention is limited only by the spirit and scope of the appended claims. The abstract of the disclosure is provided to comply with the rules requiring an abstract, which will allow a searcher to quickly ascertain the subject matter of the technical disclosure of any patent issued from this disclosure. It is submitted with the understanding that it will not be used to interpret or limit the scope or meaning of the claims. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A non-volatile memory (NVM) device, comprising:
    a first fin having a first end and a second end and extending along a first direction from the first end to the second end, the first fin comprising:
    a source region in the first end;
    a drain region in the second end; and
    a channel region extending between the source region and the drain region;
    a second fin extending substantially parallel to the first fin and being spaced-apart from the first fin, the second fin having a single conductivity type; and
    a floating gate formed over and electrically insulated from the first fin and the second fin, the floating gate extending along a second direction and fully covering the channel region;
    wherein the channel region has a conductivity type opposite to that of the source region, the drain region and the second fin;
    wherein the first direction is substantially perpendicular to the second direction; and
    wherein the second fin works as a control gate.

2. The NVM device according to claim 1, further comprising:
    a substrate; and
    an isolation layer formed on the substrate;
    wherein the first fin and the second fin are formed on the isolation layer; and
    wherein the floating gate further covers portions of the isolation layer along the second direction.

3. The NVM device according to claim 1, further comprising:
    a substrate;
    an epitaxial silicon structure comprising a buried layer of high concentration impurity grown on the substrate; and
    a Plurality of trenches formed along sidewalls of the first fin and the second fin;
    wherein the first fin and the second fin are formed on the epitaxial silicon structure;
    wherein the plurality of trenches are filled with an insulating material to a predetermined height; and
    wherein the floating gate further covers portions of the insulating material along the second direction.

4. The NVM device according to claim 1, further comprising:
    a tunneling dielectric layer sandwiched between the channel region and the floating gate; and
    a coupling dielectric layer sandwiched between the second fin and the floating gate.

5. The NVM device according to claim 4, wherein when a voltage $V_{CG}$ is applied to the control gate, a floating gate voltage $V_f$ is given by: $V_f=(V_{CG} \times C_R)$, wherein $C_R=C_{CG}/(C_{CG}+C_{MOS})$, and wherein $C_{CG}$ is a capacitance between the floating gate and the control gate, and $C_{MOS}$ is a capacitance between the floating gate and the channel region.

6. The NVM device according to claim 4, wherein a threshold voltage shift $\Delta V_{thC}$ of the NVM device is given by: $\Delta V_{thC}=-Q/C_{CG}$, and wherein Q is an amount of charges on the floating gate and $C_{CG}$ is a capacitance between the control gate and the floating gate.

7. The NVM device according to claim 4, wherein when no charges are stored on the floating gate, a threshold voltage $V_{thD}$ approximates to $(V_{thC} \times C_R)$, wherein $C_R=C_{CG}/(C_{CG}+C_{MOS})$, wherein $C_{CG}$, is a capacitance between the floating gate and the control gate, and $C_{MOS}$ is a capacitance between the floating gate and the channel region, wherein $V_{thD}$ is a threshold voltage of the NVM device with the floating gate and the control gate connected together, and wherein $V_{thC}$ is an intrinsic threshold voltage of the NVM device.

8. The NVM device according to claim 4, wherein When a voltage $V_{CG}$ is applied to both the control gate and the floating gate, there is no capacitance coupling from the control gate to the floating gate.

9. The NVM device according to claim 1, wherein the floating gate and the first fin form a body of a fin MOSFET.

10. The NVM device according to claim 4, wherein the second fin is doped with a first impurity of a first conductivity type having a first concentration and the channel region is doped with a second impurity of a second conductivity type having a second concentration, and wherein the first concentration is higher than the second concentration and the first conductivity type is opposite to the second conductivity type.

\* \* \* \* \*